United States Patent [19]

Mori et al.

[11] Patent Number: 5,270,104

[45] Date of Patent: Dec. 14, 1993

[54] UNSATURATED POLYESTER RESIN COMPOSITION AND LAMINATES

[75] Inventors: Seiichi Mori; Kazuhide Fujimoto; Satoshi Tonoki, all of Kobe, Japan

[73] Assignee: Kanegafuchi Kagaku Kogyo Kabushiki Kaisha, Osaka, Japan

[21] Appl. No.: 925,410

[22] Filed: Aug. 10, 1992

Related U.S. Application Data

[63] Continuation of Ser. No. 604,408, Oct. 29, 1990, abandoned, which is a continuation of Ser. No. 253,325, Oct. 3, 1988, abandoned, which is a continuation of Ser. No. 6,339, Feb. 2, 1987, abandoned, which is a continuation of Ser. No. 857,382, Apr. 21, 1986, abandoned, which is a continuation of Ser. No. 506,780, Jun. 22, 1983, abandoned.

[30] Foreign Application Priority Data

Jun. 22, 1982 [JP] Japan ................................. 57-108049

[51] Int. Cl.$^5$ ......................... B32B 27/04; B32B 27/36
[52] U.S. Cl. ..................................... 428/220; 428/481; 428/480; 525/44; 525/444
[58] Field of Search .................. 525/44, 444; 428/481, 428/220, 482

[56] References Cited

U.S. PATENT DOCUMENTS

| | | | |
|---|---|---|---|
| 3,733,370 | 5/1973 | Thompson | 525/44 |
| 3,804,920 | 4/1974 | Cunningham | 525/444 |
| 4,148,765 | 4/1979 | Nelson | 260/22 |
| 4,224,430 | 9/1980 | Maekawa et al. | 526/282 |
| 4,233,432 | 11/1980 | Curtis, Jr. | 528/298 |
| 4,253,665 | 3/1981 | Miller et al. | 273/63 G |
| 4,274,994 | 6/1981 | Riew | 525/39 |
| 4,287,313 | 9/1981 | Uber | 525/44 |
| 4,309,519 | 1/1982 | Obara et al. | 525/445 |
| 4,363,907 | 12/1982 | Hefner et al. | |

FOREIGN PATENT DOCUMENTS

907245 8/1972 Canada ............................... 402/215
2073214 10/1981 United Kingdom .

OTHER PUBLICATIONS

Lubin, G. Handbook of Composites, p. 18, Van Nostrand Reinhold Co. 1982.
Nelson, Considerations: Dicyclopentadiene in Polyester Resins, 36th Annual Conference, Reinforced Plastics/Composites Institute, The Society of Plastic Industry, Inc. Feb. 16-20, 1981 (preprint).
Vrany, Chemical Abstracts, vol. 48, Item 9421h (1964).
Vrany, "Cyklopentadienove suorviny pro nenasycene polyesterove pryskyrice" (title of book unknown), pp. 78-79.
Japanese Published Examined Patent Appln. No. 10825/1970 of Hitachi Kasei Kogyo Co., Ltd., and English translation thereof.
The Merck Index, "Maleic Anhydride", p. 631 (1960).
Nelson, Preprint, 36th Annual Conference, Reinforced Plastics/Composites Institute, The Society of the Plastics Industry, Feb. 16-20, 1981.

*Primary Examiner*—Patricia A. Short
*Attorney, Agent, or Firm*—Armstrong, Westerman, Hattori, McLeland & Naughton

[57] ABSTRACT

An unsaturated polyester resin composition comprising:

(a) 30 to 99% by weight of an unsaturated polyester resin comprising a crosslinking monomer and an unsaturated alkyd obtained by reacting at least dicyclopentadiene (hereinafter abbreviated as "DCPD"), an unsaturated polycarboxylic acid and a polyhydric alcohol, and (b) 1 to 70% by weight of a hardness adjusting unsaturated polyester resin.

Sheets of base material can be impregnated with the resin composition effectively to give a laminate which is satisfactorily punchable at low temperatures and yet has high resistance to thermal softening and outstanding electrical characteristics.

2 Claims, No Drawings

UNSATURATED POLYESTER RESIN COMPOSITION AND LAMINATES

This application is a continuation of application of Ser. No. 604,408 filed Oct. 29, 1990, now abandoned, which was a continuation of Ser. No. 253,325, filed Oct. 3, 1988, now abandoned, which was a continuation of Ser. No. 006,339, filed Feb. 2, 1987, now abandoned, which was a continuation of application Ser. No. 857,382, filed Apr. 21, 1986, now abandoned, which was a continuation of application Ser. No. 506,780, filed Jun. 22, 1983, now abandoned.

The present invention relates to an unsaturated polyester resin composition and laminates for electric use which are prepared from the resin composition. More particularly, the invention relates to an unsaturated polyester resin composition which is available at a low cost and with which cellulose base materials can be impregrated effectively to give laminates which can be satisfactorily punched at low temperatures, the laminates nevertheless having high resistance to thermal softening and outstanding electrical characteristics. The invention further relates to such laminates for electric use.

The term "laminates for electric use" or "electric laminates" as used herein refers to laminates or laminates clad with metal foil which are used, for example, as base boards for various electronic parts and which are in the form of a plate having a thickness, for example, of 0.5 to 5 mm.

Such laminates are prepared by pretreating a cellulosic base material with methylol compound or the like, then impregnating the base material with an unsaturated polyester resin, thereafter laminating sheets of the base material and curing the resulting assembly. For example, see Published Unexamined Japanese Patent Application No. 98136/1981.

The unsaturated polyester resin is composed of an unsaturated alkyd and a crosslinking monomer. Usable as the alkyd is, for example, a compound which is well known and has the molecular structural formula of

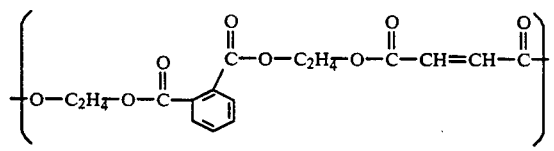

It is well known that the properties of unsaturated polyesters are variable over a wide range in accordance with the selection of materials therefor, i.e., polyhydric alcohol, unsaturated polybasic acid, saturated polybasic acid, etc.

However, electric laminates, especially those incorporating a paper base material, must have extremely contradictory properties; for example, they must be resistant to thermal softening even when treated in a solder bath having as high a temperature as 260° C. while possessing satisfactory punchability at low temperatures. Although we made investigations into various unsaturated polyester resins commercially available for the single use thereof or conjoint use of at least two of such resins, we were unable to obtain satisfactory laminates, because laminates which were amenable to punching at low temperatures were low in flexural modulus at high temperatures, whereas those satisfactory in the modulus at high temperatures had reduced punchability at low temperatures.

To overcome the above problem, we have conducted intensive research and found that an electric laminate satisfactory in both punchability at low temperatures and resistance to thermal softening and outstanding in electrical characteristics can be prepared by impregnating sheets of a base material with an unsaturated polyester resin composition comprising (a) 30 to 99% by weight of an unsaturated polyester resin comprising a crosslinking monomer and an unsaturated alkyd obtained by reacting at least dicyclopentadiene (hereinafter abbreviated as "DCPD"), an unsaturated polycarboxylic acid and a polyhydric alcohol, and (b) 1 to 70% by weight of a hardness adjusting unsaturated polyester resin, laminating the sheets and curing the resulting assembly. Thus, we have accomplished the present invention, which will be described below in detail.

First, unsaturated polyester resins useful in this invention will be described.

Unsaturated alkyds containing DCPD are known and are prepared by reacting DCPD, an unsaturated polycarboxylic acid, a polyhydric alcohol and, when required, a saturated polycarboxylic acid.

Useful unsaturated polycarboxylic acids are usually maleic anhydride, fumaric acid and like unsaturated dicarboxylic acids and anhydrides thereof. Useful polyhydric alcohols include ethylene glycol, propylene glycol, diethylene glycol, dipropylene glycol, glycerin, trimethylolpropane, pentaerythritol, etc. Useful saturated polycarboxylic acids include phthalic anhydride, isophthalic acid, terephthalic acid, adipic acid, sebacic acid, azelaic acid, trimellitic acid, pyromellitic acid, etc. and anhydrides of such acids.

For the preparation of DCPD-containing unsaturated alkyds, it is convenient to use maleinized DCPD represented by the formula

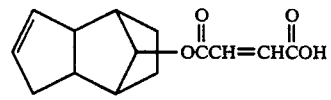

and obtained by reacting DCPD with maleic acid (or maleic anhydride and water) at a temperature of up to 140° C. This compound can also be prepared by reacting hydroxylated DCPD with maleic anhydride. The unsaturated alkyd is obtained by the dehydration condensation of the maleinized DCPD, the remaining polycarboxylic acid component and polyhydric alcohol at about 150° to about 210° C.

Further when isophthalic acid, fumaric acid or like high-melting polycarboxylic acid is used, the polycarboxylic acid component and the polyhydric alcohol are subjected to dehydration condensation first to obtain an oligoester, to which maleinized DCPD is added for further condensation, whereby a light-colored unsaturated alkyd can be obtained with reduced formation of scales.

With the progress of the reaction, maleic groups derived from the maleinized DCPD and maleic anhydride are fumarinized. The fumarinization degree ([fumaric groups/(maleic groups+fumaric groups)]×100) to be achieved by the reaction varies with the reaction conditions and is adjustable to a desired value generally of at least 50%.

When reacting maleinized DCPD (a) with the polyhydric alcohol (b) and the remaining polycarboxylic acid component (c) directly or with the oligoester resulting from the latter two components, the proportion of the maleinized DCPD in the overall acid component in terms of mole number, i.e., $$(a)/((a) + (c)),$$

, is preferably 40 to 80 mole %.

If the proportion of the maleinized DCPD in the overall acid component is less than 40 mole %, the unsaturated alkyd molecule contains an insufficient amount of DCPD and fails to fully exhibit its characteristics, giving the resulting resin composition insufficient resistance to thermal softening at high temperatures. On the other hand, if the proportion exceeds 80 mole %, the resin obtained is hard and brittle, requires a large amount of hardness adjusting resin to assure satisfactory punchability at low temperatures, easily softens thermally at high temperatures and encounters difficulty in retaining satisfactory electrical characteristics. Thus, various drawbacks result. For the preparation of laminates for electric use which can be punched satisfactorily at low temperatures and are improved in resistance to thermal softening and in electrical characteristics, it is desirable that the proportion of the maleinized DCPD in the acid component be 40 to 80 mole %.

To modify the properties of the unsaturated polyester, it is possible to use small amounts of organic acid and alcohol for the condensation according to the invention. Examples useful for this purpose are fatty acids and alcohols having about 8 to about 22 carbon atoms, such as lauric acid, palmitic acid, stearic acid, oleic acid, lauryl alcohol, oleyl alcohol, etc.

The unsaturated alkyd obtained by reacting maleinized DCPD with a polyhydric alcohol and the remaining acid component directly or after the formation of an oligoester is sealed off chiefly with the maleinized DCPD at the terminals of each molecule, has a low molecular weight and therefore has low viscosity. When cured, the alkyd possesses a bulky DCPD skeleton, is accordingly resistant to heat, does not readily absorb moisture due to its hydrophobic properties and appears to exhibit improved characteristics when loaded with moisture.

The unsaturated polyester resin composition of the present invention comprises 30 to 99% by weight of an unsaturated polyester resin (a) composed of the above-mentioned unsaturated alkyd and a crosslinking monomer, and 1 to 70% by weight of a hardness adjusting unsaturated polyester resin (b) blended with the resin (a).

The hardness adjusting unsaturated polyester resin (b) to be used in this invention is a resin which is admixed with the unsaturated polyester resin (a) to adjust the hardness of the resin (a) on curing and also to assure other characteristics in balance. Although the resin for this purpose is not particularly limited, especially suitable are soft unsaturated polyester resins, such as those containing a polyol component or acid component which functions as a soft segment. Examples of preferred soft resins which are commercially available are Polymal ® 6320F manufactured by Takeda Chemical Industries, Ltd., Rigolac ® 70F manufactured by Showa Kobunshi Co., Ltd., Ester ® F2240 manufactured by Mitsui-Toatsu Co., Ltd., etc. The amount of the hardness adjusting unsaturated polyester resin to be used, which of course varies with the properties desired for the resin composition to be obtained, is 1 to 70% by weight, preferably 10 to 60% by weight, based on the composition.

In addition to the soft unsaturated polyester resin, it is also possible to use an unsaturated polyester resin having a large quantity of unsaturated bonds, bisphenol type unsaturated polyester resin or like hard unsaturated polyester resin.

While the crosslinking monomer is typically styrene, also usable are α-methylstyrene, vinyltoluene, chlorostyrene, divinylbenzene, $C_1$-$C_{10}$ alkyl acrylates, $C_1$-$C_{10}$ alkyl methacrylates, diallyl phthalate, triallyl cyanurate and like monomers, and mixtures of styrene and such monomers.

In view of the mechanical properties and viscosity of the resin composition and the ability thereof to penetrate into the base material for impregnation, the total amount of the crosslinking monomer is preferably 20 to 50% by weight based on the composition.

The resin composition of the present invention can be cured with use of organic peroxides which are generally employed. Especially when one or a plurality of peroxyketals, dialkyl peroxides and peroxyesters are used, favorable results are achieved with respect to the resistance of laminates to soldering heat, and the electrical insulation characteristics and adhesion thereof. Examples of preferred organic peroxides are peroxyketals such as 1,1-bis(t-butylperoxy)-3,3,5-trimethylcyclohexane and 1,1-bis(t-butylperoxy)cyclohexane, dialkyl peroxides such as di-t-butyl peroxide, peroxyesters such as t-butylperoxy benzoate, etc. Such peroxides are used in an amount of about 0.5 to about 2.0 parts by weight based on the resin composition.

Useful curing catalysts are not limited to those given above; also usable singly or conjointly with organic peroxides are photosensitive curing catalysts, curing catalysts which are sensitive to electron rays or like radiation, and other known curing catalysts. Of course, the composition may have further incorporated therein a flame retardant, flame-retardant auxiliary agent, polymerization inhibitor, ultraviolet absorber, filler, coloring agent, etc. in accordance with the contemplated purpose.

The unsaturated polyester resin composition of the present invention is favorably usable for producing electric laminates by a known method. Stated more specifically, such a laminate can be produced by impregnating a base material with the resin composition, laminating sheets of the impregnated base material and curing the resulting assembly, with a metal foil superposed on one or both sides of the assembly in the case of metal-clad laminate. Examples of useful base materials are glass cloth, glass mat and like materials and, preferably, cellulosic materials or those made of a blend of such materials. Kraft paper and linter paper are especially preferable to use. When kraft paper or linter paper is used, it is desirable to pre-impregnate the paper with an N-methylol compound, such as melamine, before the impregnation with the present resin composition to give the base material enhanced affinity for the resin composition.

When curing the assembly of laminated resin-impregnated base sheets, it is most preferable to continuously cure the assembly substantially without applying any shaping pressure thereto.

Base materials can be impregnated with the resin composition of the invention effectively and rapidly to give laminates. The laminates obtained can be punched satisfactorily at low temperatures and are outstanding in resistance to thermal softening and in electrical characteristics.

The present invention will be described in detail with reference to the following examples, in which the parts and percentages are by weight.

PREPARATION EXAMPLE 1

A 792 g quantity of DCPD, 588 g of maleic anhydride and 113 g of water were placed into a 3-liter flask equipped with a stirrer, thermometer, reflux tube and nitrogen supply tube and were heated at 130° to 140° C. with stirring for 2.5 hours in a nitrogen stream to quantitatively obtain maleinized DCPD (A) having an acid value of 224.

To the maleinized DCPD were added 294 g of maleic anhydride, 197 g of ethylene glycol and 337 g of diethylene glycol. The reflux tube was replaced by a fractionating column, and a reflux condenser was connected to the flask for the removal of the water formed. The mixture was subjected to dehydration condensation at 145° to 197° C. in a nitrogen stream to an acid value of 20, giving an unsaturated alkyd (B). After the internal temperature of the flask lowered to 150° C., mg of hydroquinone was added to the product, and 840 g of styrene monomer was further added at 100° C., giving 2990 g of an unsaturated polyester resin (C) having a styrene concentration of 28%.

PREPARATION EXAMPLE 2

A 348 g quantity of fumaric acid, 195 g of ethylene glycol and 334 g of diethylene glycol were placed into a 3-liter flask equipped with a stirrer, thermometer, fractionating column and nitrogen supply tube and were subjected to dehydration condensation at 150° to 195° C. in a nitrogen stream to an acid value of 8.5.

A 1488 g quantity of maleinized DCPD (A) was further placed into the flask, and the mixture was reacted at 150° to 196° C. to an acid value of 18.3. When the internal temperature of the flask lowered to 150° C. after the completion of the reaction, 295 mg of hydroquinone was added to the reaction mixture, and 826 g of styrene monomer was further added at 100° C., giving 2950 g of an unsaturated polyester resin (D) having a styrene concentration of 28%.

PREPARATION EXAMPLE 3

A 498 g of isophthalic acid, 195 g of ethylene glycol and 334 g of diethylene glycol were reacted in the same manner as in Preparation Example 2 to obtain an ester having an acid value of 16.4. Further 1488 g of maleinized DCPD (A) was added to the ester, and the mixture was reacted to an acid value of 28. To the reaction mixture were added mg of hydroquinone and 889 g of styrene to obtain 3170 g of an unsaturated polyester resin (E) having a styrene concentration of 28%.

PREPARATION EXAMPLE 4

Into the same reactor as used in Preparation Example 2 were placed 888 g of phthalic anhydride, 294 g of maleic anhydride and 1050 g of diethylene glycol, and the mixture was reacted at 150° to 193° C. in a nitrogen stream to an acid value of 19.5. After the completion of the reaction, 300 mg of hydroquinone and 1060 g of styrene monomer were added to the mixture, giving 3030 g of an unsaturated polyester resin (F) free from DCPD and having a styrene concentration of 35%.

Pretreatment of base material

A solution of 15 parts by weight of methylolmelamine (Nicaresin® S-305, product of Nippon Carbide Industries Co., Ltd.) in 35 parts by weight of water was poured into a solution of 1.5 parts by weight of oleic acid monoglyceride (Rikemal® OL-100, product of Riken Vitamin Oil Co., Ltd.) in 65 parts by weight of methanol with vigorous stirring to prepare a treating suspension. Kraft paper, 285µ in thickness, was immersed in the suspension, then withdrawn and thereafter heated at 120° C. for 20 minutes for drying to obtain pretreated base material. The paper had deposited therein 14.5% of the treating agent.

Preparation of unsaturated polyester resin compositions and laminates

EXAMPLE 1

The unsaturated polyester resin (C) (64 parts) obtained in Preparation Example 1, 36 parts of a soft unsaturated polyester resin (Polymal® 6320F, product of Takeda Chemical Industries, Ltd. 37% styrene, remainder polymer structure: 12.5% fumaric acid, 18.7% adipic acid, 18.7% isophthalic acid and 50% diethylene glycol) and 1 part of an organic peroxide curing catalyst (Perhexa® 3M, product of Nippon Oils & Fats Co., Ltd.) were mixed together to prepare an unsaturated polyester resin composition (I).

EXAMPLE 2

The unsaturated polyester resin (C) (71 parts), 27 parts of Polymal 6320F, 2 parts of styrene and 1 parts of Perhexa 3M were mixed together to obtain a composition (II).

EXAMPLE 3

The unsaturated polyester resin (D) (64 parts), 36 parts of Polymal 6320F and 1 part of Perhexa 3M were made into a composition (III).

EXAMPLE 4

The unsaturated polyester resin (E) (71 parts), 27 parts of Polymal 6320F, 2 parts of styrene and 1 part of Perhexa 3M were formulated into a composition (IV).

COMPARATIVE EXAMPLE 1

The unsaturated polyester resin (C) (100 parts) and 1 part of Perhexa 3M were mixed together to obtain a composition (V) containing no hardness adjusting resin.

COMPARATIVE EXAMPLE 2

The unsaturated polyester resin (F) (100 parts) and 1 part of Perhexa 3M were mixed together to obtain a composition (VI).

Preparation of laminates

The pretreated base material of paper was impregnated with the resin composition prepared above, five sheets of the impregnated material were laminated, and the assembly was heated at 100° C. for 15 minutes and at 160° C. for 10 minutes for curing, with both sides of the assembly covered with a polyethylene terephthalate film 35µ in thickness, to obtain a laminate. The same procedure as above was repeated with use of the resin compositions of Examples 1 to 4 and Comparison Examples 1 and 2 to prepare laminates (I)′, (II)′, (III)′, (IV)′ and (V)′, (VI)′, each 1.52 mm in thickness. The properties of the resin compositions are shown in Table 1, and the properties of the laminates in Table 2.

TABLE 1

| Unsaturated polyester resin compositions | | | | | |
|---|---|---|---|---|---|
| | Examples 1-4 | | | Comp. Ex. 1, 2 | |
| | I | II | III | IV | V | VI |
| Styrene concentration (%) | 30.9 | 31.5 | 30.9 | 31.5 | 27.7 | 34.7 |
| Viscosity (poises at 20° C.) | 3.28 | 3.35 | 4.65 | 6.15 | 3.01 | 6.87 |
| Impregnation time* (seconds) | 18.5 | 20.1 | 25.0 | 28.7 | 15.3 | 34.3 |

*Time taken for the melamine-treated base material to be completely impregnated with the resin composition.

TABLE 2

| | Laminates | | | | | |
|---|---|---|---|---|---|---|
| | Examples 1-4 | | | | Comp. Ex. 1, 2 | |
| | (I)' | (II)' | (III)' | (IV)' | (V)' | (VI)' |
| Insulation resistance (Ω, D-2/100) | $1.53 \times 10^9$ | $1.10 \times 10^9$ | $1.87 \times 10^9$ | $9.0 \times 10^8$ | $5.36 \times 10^9$ | $3.45 \times 10^8$ |
| Flexural modulus (kg/mm², 100° C.) | 221 | 252 | 342 | 180 | 387 | 148 |
| Punchability (at 50-80° C.) | | | | | | |
| End faces | Excellent | Good | Good | Excellent | Poor | Excellent |
| Surface | Excellent | Excellent | Excellent | Excellent | Poor | Excellent |
| Holes | Excellent | Excellent | Excellent | Excellent | Poor | Excellent |

Test methods
Insulation resistance: JIS C-6481.
Flexural modulus: Same as above.
Punchability: With use of a die having 23 pins 1 mm in diameter and aligned with a pitch of 2.54 mm.

What is claimed is:

1. A laminate for electrical use comprising a plurality of cured laminated sheets of a base material impregnated with an unsaturated polyester resin composition consisting essentially of:
   (a) 64 to 73% by weight of an unsaturated polyester resin comprising (1) a crosslinking monomer and (2) an unsaturated alkyd consisting of the reaction product of maleinized dicyclopentadiene, an unsaturated polycarboxylic acid and a polyhydric alcohol, wherein the ratio of the amount of maleinized dicyclopentadiene to the sum of the amounts of maleinized dicyclopentadiene and unsaturated polycarboxylic acid is 40-80 mole %;
   (b) 36 to 27% by weight of a hardness adjusting soft unsaturated polyester resin which is different from said unsaturated alkyd and contains 50 mole % of diethylene glycol as a soft segment-producing polyol component and 18.7 mole % of adipic acid as its soft segment-producing polycarboxylic acid component; and
   (c) a curing catalyst.

2. A laminate for electrical use comprising a plurality of cured laminated sheets of a base material impregnated with an unsaturated polyester resin composition, wherein the unsaturated polyester resin composition consists essentially of:
   (a) 64 to 73% by weight of an unsaturated polyester resin comprising (1) a crosslinking monomer and (2) an unsaturated alkyd consisting of the reaction product of maleinized dicyclopentadiene, an unsaturated polycarboxylic acid and a polyhydric alcohol, wherein the ratio of the amount of maleinized dicyclopentadiene to the sum of the amounts of maleinized cyclopentadiene and unsaturated polycarboxylic acid is 40-80 mole %;
   (b) 36 to 27% by weight of a hardness adjusting soft unsaturated polyester resin which is different from said unsaturated alkyd and contains diethylene glycol as a soft segment-producing polyol component and adipic acid as its soft segment-producing polycarboxylic acid component; and
   (c) a curing catalyst,
and wherein said laminate has a thickness of 0.5-5 mm, a flexural modulus of at least 180 Kg/mm² at 100° C., and a punchability at 50°-80° C. suitable for electrical use.

* * * * *